(12) United States Patent
Graesslin et al.

(10) Patent No.: US 8,390,288 B2
(45) Date of Patent: Mar. 5, 2013

(54) METHOD AND RF TRANSMITTER ARRANGEMENT FOR GENERATING RF FIELDS

(75) Inventors: Ingmar Graesslin, Boenningstedt (DE); Peter Boernert, Hamburg (DE); Peter Vernickel, Hamburg (DE); Ulrich Katscher, Norderstedt (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 529 days.

(21) Appl. No.: 12/598,451

(22) PCT Filed: Apr. 24, 2008

(86) PCT No.: PCT/IB2008/051590
§ 371 (c)(1),
(2), (4) Date: Nov. 2, 2009

(87) PCT Pub. No.: WO2008/135883
PCT Pub. Date: Nov. 13, 2008

(65) Prior Publication Data
US 2010/0141259 A1    Jun. 10, 2010

(30) Foreign Application Priority Data
May 4, 2007  (EP) ..................... 07107539

(51) Int. Cl.
*G01V 3/00*    (2006.01)
(52) U.S. Cl. ........................ 324/318; 324/322
(58) Field of Classification Search .......... 324/318, 324/322, 312, 314
See application file for complete search history.

(56) References Cited

U.S. PATENT DOCUMENTS

| 4,682,112 | A | 7/1987 | Beer |
| 6,650,118 | B2 | 11/2003 | Leussler |
| 6,900,636 | B2 | 5/2005 | Leussler |
| 7,049,819 | B2 | 5/2006 | Chan et al. |
| 7,183,770 | B2 * | 2/2007 | Graβlin et al. ............... 324/322 |
| 7,525,313 | B2 * | 4/2009 | Boskamp et al. ............ 324/318 |
| 7,633,293 | B2 * | 12/2009 | Olson et al. ................. 324/318 |
| 8,026,721 | B2 * | 9/2011 | Sodickson et al. ........... 324/318 |
| 2005/0099178 | A1 | 5/2005 | King et al. |
| 2006/0273798 | A1 | 12/2006 | Klieger et al. |

FOREIGN PATENT DOCUMENTS

| WO | 0208778 A1 | 1/2002 |
| WO | 2005109010 A2 | 11/2005 |
| WO | 2005124380 A2 | 12/2005 |
| WO | 2006117714 A2 | 11/2006 |

OTHER PUBLICATIONS

Adriany, G., et al.; Transmit and Receive Transmission Line Arrays for 7 Tesla Parallel Imaging; 2005; Magnetic Resonance in Medicine; 53:434-445.

(Continued)

Primary Examiner — Louis Arana

(57) ABSTRACT

A multi-channel RF transmitter arrangement comprising a plurality of RF transmitter elements like RE antennas, antenna elements, coils or coil elements, for generating an RF field, especially for use in a magnetic resonance imaging system for exciting nuclear magnetic resonances, and a method for generating such an RF field wherein the RF transmitter elements are segmented in a plurality of segments at least along the direction of one or more of the main magnetic field of the MRI system, the z-direction or the longitudinal direction.

9 Claims, 3 Drawing Sheets

OTHER PUBLICATIONS

Mao, W., et al.; Exploring the Limits of RF Shimming for High-Field MRI of the Human Head; 2006; Magnetic Resonance in Medicine; 56:918-922.

Pinkerton, R. G., et al.; Transceive Surface Coil Array for Magnetic Resonance Imaging of the Human Brain at 4T; 2005; Magnetic Resonance in Medicine; 54:499-503.

Vernickel, P., et al.; An Eight channel Transmit/Receive Body Coil for 3T; 2006; Proc. Intl. Soc. Mag. Reson. Med.; 14:123.

Vernickel, P., et al.; Eight-Channel Transmit/Receive Body MRI Coil at 3T; 2007; Magnetic Resonance in Medicine; 58:381-389.

Wright, S. M., et al.; Theory and Application of Array Coils in MR Spectroscopy; 1997; NMR in Biomedicine; 10:394-410.

* cited by examiner

A

B1

B2

B3

C

D

METHOD AND RF TRANSMITTER ARRANGEMENT FOR GENERATING RF FIELDS

FIELD OF INVENTION

The invention relates to an RF transmitter arrangement comprising a plurality of RF transmitter elements like RF antennas, antenna elements, coils or coil elements or other resonator elements, for generating an RF field, especially for use in a magnetic resonance imaging (MRI) system for exciting nuclear magnetic resonances (NMR). The invention further relates to a method for generating such an RF field.

Furthermore, the invention relates to a multi-channel RF transmit system comprising a plurality of RF waveform generators and RF amplifiers, for generating RF transmit signals for feeding such a multi-channel RF transmitter arrangement, especially for use as an RF excitation system in an MRI system.

The invention as well relates to an MRI system comprising such a multi-channel RF transmit or excitation system and such a multi-channel RF transmitter arrangement.

BACKGROUND OF THE INVENTION

Conventional MR systems use one RF transmit coil (e.g. a quadrature body coil (QBC)) fed with a single RF signal. Multi-channel transmit systems use coils with N elements that are fed by N independent RF signals which can be varied in phase and amplitude. With these systems, it is possible to improve image homogeneity, which homogeneity often represents a problem at higher RF field strengths due to so called dielectric resonances or wave propagation effects within an examination object. By using multi-dimensional spatially selective RF pulses and other techniques of RF shimming more homogeneous images can be obtained. Furthermore, parallel RF transmission enables many interesting new technical features like the acceleration of RF pulses for local or zoom imaging.

SUMMARY OF THE INVENTION

With increasing field strength, image inhomogeneity problems which are caused by signal intensity variations are increasing. Furthermore, the specific absorption (SAR) rate limits the possible RF duty cycle in order not to violate existing SAR limits and not to compromise patient safety. Finally, there is a need that higher reduction factors for parallel RF transmission can be achieved.

Consequently, one object underlying the invention is to provide an RF transmitter arrangement and a multi-channel RF transmit system which offers an increased flexibility of applying a spatial RF field pattern which for example can be used to correct for susceptibility artifacts that cause inhomogeneities in the RF field.

The object is solved by an RF transmitter arrangement comprising: a plurality of elements for generating an RF field for exciting nuclear magnetic resonances in an MRI system, wherein the elements are segmented in a plurality of segments at least along one of a direction of a main magnetic field of the MRI system, a z-direction, and a longitudinal direction, a multi-channel RF transmit system comprising: a plurality of RF waveform generators and RF amplifiers for generating RF transmit signals for individually feeding the elements and/or segments of the RF transmitter arrangement and a method for generating an RF field wherein one or more of the elements and/or one or more of the segments are individually controlled or driven for generating a desired pattern of an RF field.

This solutions according to the invention are especially advantageous in those MRI systems with higher magnetic field strength, in which the wavelengths of the required RF transmit or excitation signals reach the dimensions of an examination object, so that wave propagation or dielectric resonance effects within the examination object and inhomogeneous RF excitation fields can occur. The impact of these unwanted effects and especially of signal intensity variations during MRI examinations can be compensated effectively and in an easy and cost-effective manner by transmitting spatially selective RF pulses by means of a independently drivable RF transmitter elements of the multi-channel RF transmit system and a multi-channel RF transmitter arrangement according to the invention.

The subclaims disclose advantageous embodiments of invention.

It will be appreciated that features of the invention are susceptible to being combined in any combination without departing from the scope of the invention as defined by the accompanying claims.

Further details, features and advantages of the invention will become apparent from the following description of preferred and exemplary embodiments of the invention, which are given with reference to the drawings.

DETAILED DESCRIPTION OF EMBODIMENTS

In contrast to existing multi-channel transmit MRI systems and coils, where the individual elements are distributed on the surface of a single cylindrical ring or are arranged along a line forming a planar band, a distribution and/or segmentation of the coils in two or three spatial-directions is provided according to the invention.

One general example of such an RF transmitter arrangement is a planar array of N×M transmitter elements (i.e. arranged in two dimensions) or an array of different rings and/or segments of cylindrically arranged transmitter elements (i.e. arranged in three dimensions).

Although this might increase the number of RF transmit channels required for driving the individual transmitter elements, such an arrangement offers the possibility of reduction of the SAR (specific absorption rate) in particular in cases where only a small volume needs to be excited by means of the RF field, and further offers better performance and flexibility for RF shimming methods (see Ibrahim et al, "Effect of RF coil excitation on field inhomogeneity at ultra high fields: a field optimized TEM resonator" in Magnetic Resonance Imaging (2001) December; 19(10): 1339-47).

Furthermore, it enables the possibility to accelerate and/or improve the performance of multi-dimensional spatially selective RF pulses, as the number of coil or transmitter elements is increased. Especially three-dimensional RF pulses benefit from this increased degree of freedom in coil design for RF transmitter arrangements, which are extended into two or three dimensions.

Another advantage is the reduction of the required power for each transmit channel for feeding the RF transmitter elements thus simplifying the design of an amplifier module delivering the required RF power.

On the basis of these RF transmitter arrangements, a number of parallel RF transmit applications can be improved and patient SAR can be reduced.

More in detail, an RF transmitter arrangements and especially an RF transmit coil is segmented according to the invention at least in the z-direction, i.e. in the longitudinal direction, i.e. along the direction of the main magnetic field of the MRI system. The transmit coil can e.g. be a body coil but as well a (flexible) surface transmit(/receive) coil.

As an examplary embodiment, a body coil is considered in the following which consists of three cylindrical sections in the z-direction. Each section consists of eight coil elements distributed along the circumference of the segment, resulting in a coil with 24 individual RF coil elements in total. The RF elements within each segment are mounted symmetrically over the radius of the coil. The RF elements are fed by individual RF power modules. Each module is connected to a waveform generator that is capable of supplying an analog RF signal that can be controlled in amplitude and phase over time.

Figure 1A:
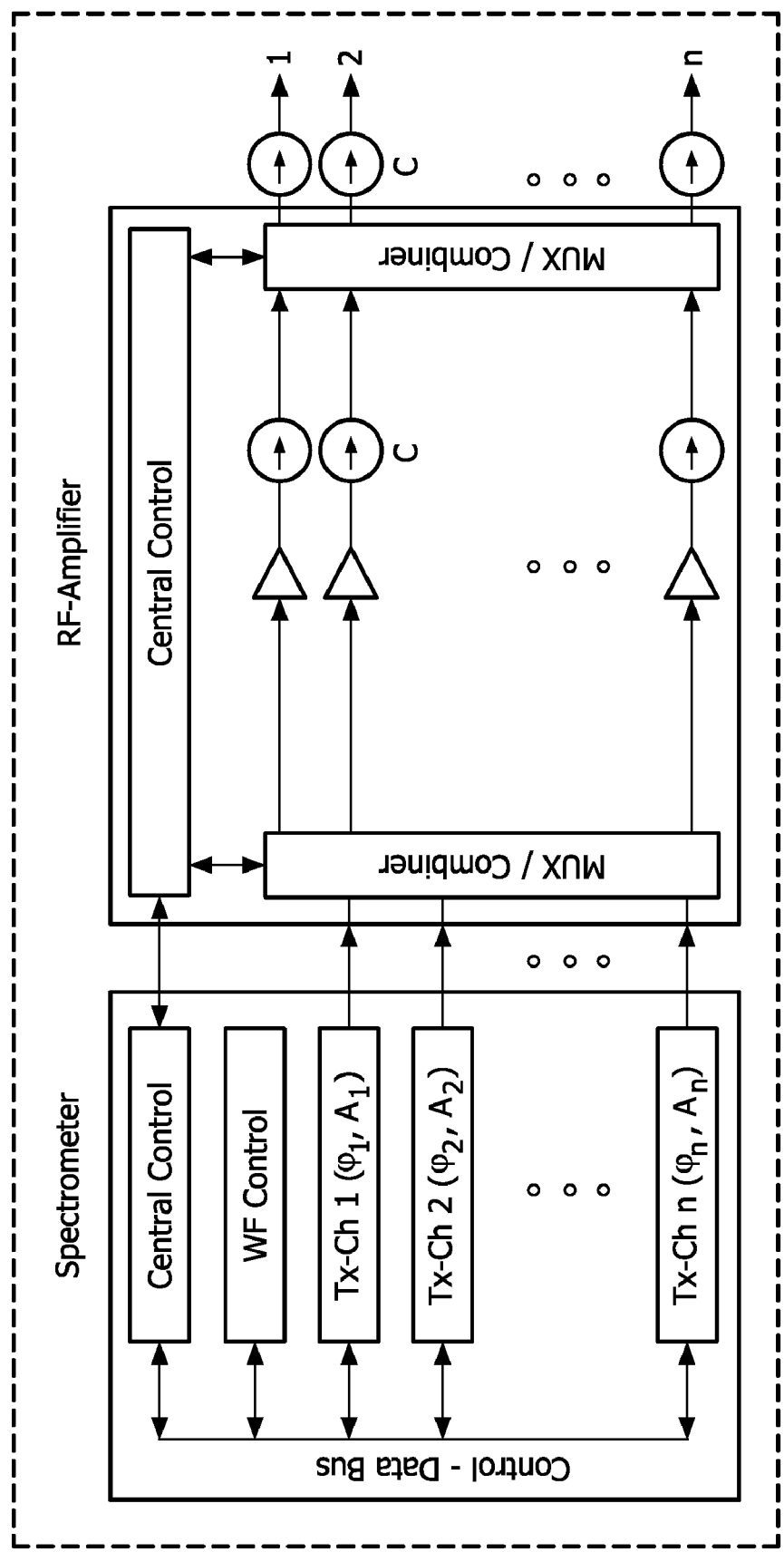
FIGS. 1a, 1b, and 1c show schematic block diagrams of a multi-channel RF transmit/receive architecture.
Figure 1B:
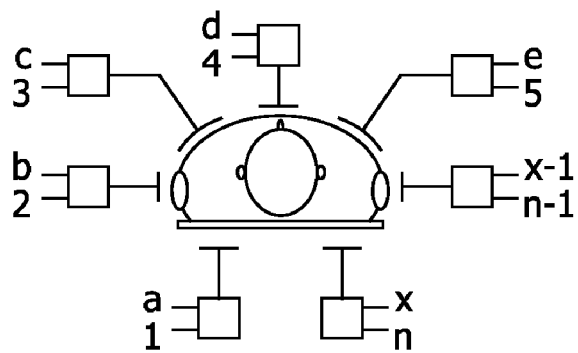
Figure 1C:
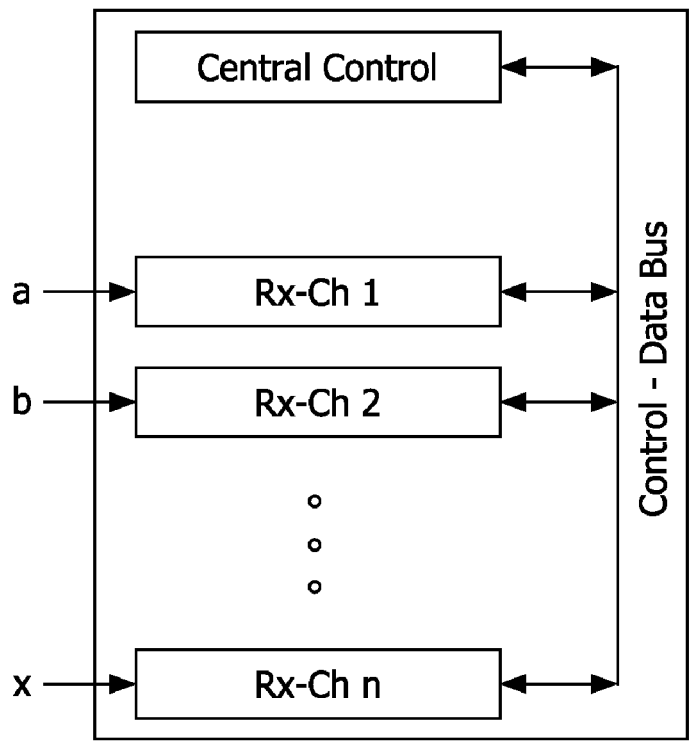

The setup is schematically depicted in FIGS. 1A, 1B and 1C. A central processing unit generates the waveform definition for every channel, that can differ in phase (or frequency) and amplitude and over time. The waveform definition is converted to RF waveforms by a waveform controller with a certain dwell time (e.g. 6.4 μs). The stream of samples is sent to the individual transmit channels Tx-Ch 1, Tx-Ch2, . . . , which carry out a digital-to-analog conversion.

The analog signal is routed to a multi-channel RF amplifier (or multiple single RF amplifiers or modules). Via a first multiplexer or combiner network MUX at the input of the RF amplifier, different inputs can be routed to different or multiple RF amplifier channels. In this way, different power levels can be realized for different channels. The number of RF amplifier channels can exceed the number of inputs or outputs and depends on the different power levels required for the individual coil elements.

At the output stage, a second multiplexer or combiner network MUX is preferably be used to route the amplified RF signals to the RF channels 1, 2, . . . n. Circulators C can optionally be used inside and/or outside the RF amplifier to dissipate any reflected power.

The RF signals are then routed via transmit/receive switches to the individual coil elements (FIG. 1B). The coil elements can be a transmit and receive (Tx/Rx) coil elements or transmit coil elements only. In case of Tx/Rx coil elements (FIG. 1C), the received RF signals are routed to n receive channels Rx-Ch1, . . . Rx-Ch n, and are processed by a processing unit to generate images to be displayed to the operator of the MRI system.

Figure 2:
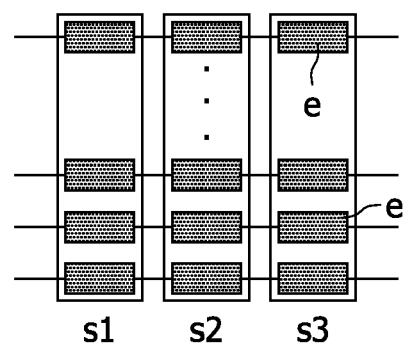
FIG. 2 shows different configurations of coil elements.
Figure 2:
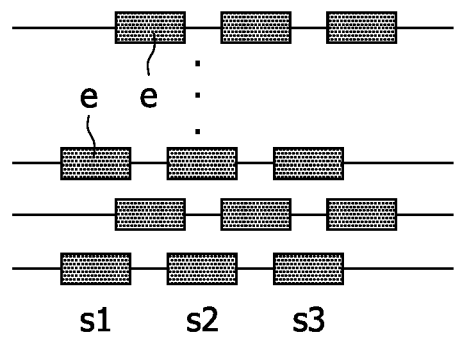
Figure 2:
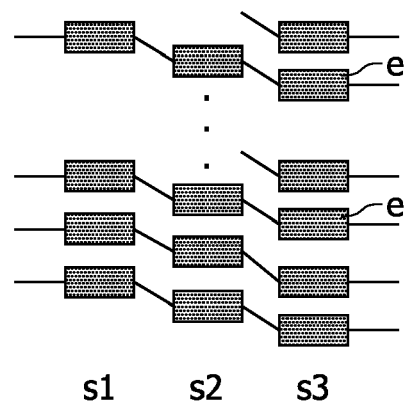
Figure 2:
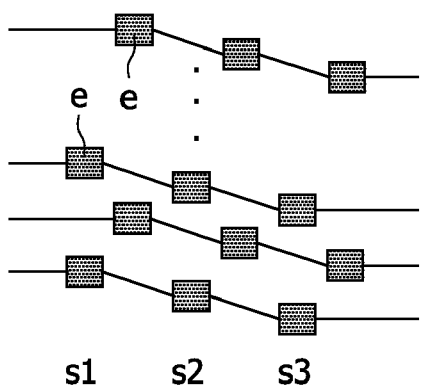
Figure 2:
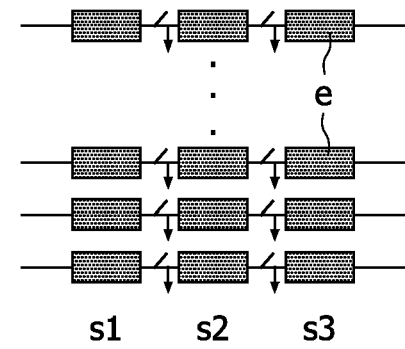
Figure 2:
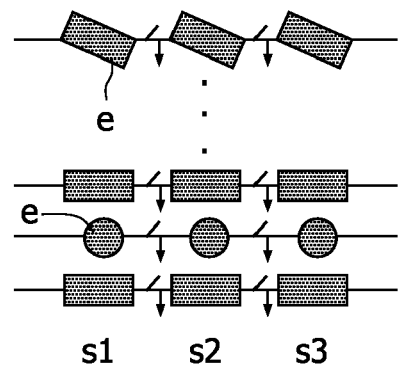

In the FIG. 2 different configurations of coil elements e are shown wherein the cylindrical RF coils are indicated rolled out into the drawing plane of FIG. 2 along the horizontal z-coordinate and the coil's circumference. For a planar two-dimensional RF transmitter arrangement the same drawing could be considered while the two coordinates correspond to the x-z plane. In FIG. 2 shows:

A: multiple elements segmented (exemplarily) three times in z-direction (every element could be driven individually, or the individual rings/segments s1, s2, s3 could be driven etc.);

B1: different geometrical arrangements (shift of segments s1, s2, s3 in z-direction);

B2: segments s1, s2, s3 are rotated with respect to one another;

B3: shift of segments s1, s2, s3 in z-direction and segments s1, s2, s3 are rotated with respect to one another;

C: indicates switches for individually driving each single element e;

D: different types of coils or coil arrangements (e.g. rotation or loop coils, strip line resonators etc.).

In case that only a small volume needs to be excited, only the RF transmitter elements of one of the three segments s1, s2, s3 are used for the excitation. Consequently, a lower global SAR can be realized, as the coil sensitivity is smaller in z-direction compared to the full length of the element.

In case of accelerating e.g. 3D spatially selective RF pulses, transmit coil based sensitivity encoding is used in three spatial directions (two in-plane, and the third in z-direction) making use of the individual segments. This can allow for higher acceleration factors and/or more stable solutions for the RF waveform with reduced SAR as compared to a RF pulse that uses only in-plane segmentation. In case of two dimensional (2D) RF pulses, a free angulation in space becomes possible, while maintaining pulse performance and minimized SAR.

If the maximum reduction factors/acceleration factors are not used to full capacity, the remaining degrees of freedom can be used for SAR reduction, which is of particular interest at higher field strength.

Furthermore, in the case of simple RF or B1 shimming, where only the phase and the amplitude of standard RF pulses are modified to improve B1 field homogeneity, better results can be obtained using a 2D/3D transmit arrays for all oblique orientations due to the increased degrees of freedom of this arrangement.

Furthermore, different segments or sub-sets of coils can be used at different stages of the experiment during an experiment. E.g. one segment is used for the excitation and another one could be used for the refocusing during a spin echo experiment, which offers interesting and more flexible applications.

In the following, variations and different embodiments of such segmented RF transmitter arrangements are described with reference to FIG. 2:

the individual coil elements are spatially placed asymmetrically over the radius (e.g. with different distances from the screen or between each other);

the screen itself is not round but oval or has even a different form (e.g. asymmetric). Then the coil elements can be distributed symmetrically or asymmetrically within the RF screen;

the individual RF elements could be rotated or tilted with respect to one another (FIG. 2, part D);

the individual RF elements could have different sizes depending on their position within the RF coil;

the surface coil transmit arrays, which could be flexible or stiff, could be used instead or in addition to a multi-channel body;

the body coil could be operated interleaved or simultaneously with the transmit(/receive) coil array. E.g. on the top of an examination object the local transmit coil elements could be used, while below the patient the body coil could be used;

the elements of one ring/segment could have different displacements in z-direction (they are not all aligned at a specific z-position) (FIG. 2, part B);

various numbers of amplifier channels could be used, e.g., m to drive the m rings/segments, or n driving n coil elements consisting of the one, two or multiple of the z-segments simultaneously, whereby z-segments adjacent or non-adjacent could be active at one time (see FIG. 2, part C). Finally, n×m amplifier modules of a few kW peak power could be used (in this case n in FIG. 2 has to be replaced by n×m);

allocation of different power levels to different channels via a switch matrix. In this way, power modules could be combined in different ways to account for different loadings of elements by the patient. This concept could be extended to supply some of the z-segmented coil elements with different power levels, while others are not driven at all. Different power levels might be required due to different shapes, positions in the coil or distances to the screen;

coil elements can have different sizes or shapes (e.g. strips, loops etc.) and even combinations of both are possible (FIG. 2, part D).

The RF transmitter arrangement according to the invention is in principle applicable to any multi-channel RF transmit systems (from 2-n channels) from low to ultra-high fields. In the first case, applications like RF pulse length reduction or the like might be the primary focus. In contrast at high fields multi-transmit technology will even be an enabler for the technical realization of whole body systems and will bring improvement in image quality e.g. for imaging using a head/body coil. Multi-transmit technology offers a new degree of freedom that enables or improves applications as e.g. RF shimming, Tx Sense, SAR reduction, local excitation, 3D pulses, RF encoding etc.

While the invention has been illustrated and described in detail in the drawings and foregoing description, such illustration and description are to be considered illustrative or exemplary and not restrictive, and the invention is not limited to the disclosed embodiments. Variations to embodiments of the invention described in the foregoing are possible without departing from the scope of the invention as defined by the accompanying claims.

Variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. An RF transmitter arrangement comprising:
   a plurality of RF transmitter elements for generating an RF field for exciting nuclear magnetic resonances in an MRI system; and
   a plurality of segments formed from the plurality of RF transmitter elements in at least two spatial directions selected from a direction of a main magnetic field of the MRI system, a z-direction, and a longitudinal direction.

2. The RF transmitter arrangement according to claim 1, wherein the RF transmitter elements are arranged in the form of a cylindrical RF coil, providing the plurality of segments in the longitudinal direction of the cylindrical coils.

3. The RF transmitter arrangement according to claim 2, wherein the segments are shifted with respect to one another in the z-direction of the cylindrical coil.

4. The RF transmitter arrangement according to claim 2, wherein the segments are rotated with respect to one another in a circumferential direction of the cylindrical coil.

5. The RF transmitter arrangement according to claim 2, wherein the segments are shifted with respect to one another in the z-direction and rotated with respect to one another in a circumferential direction of the cylindrical coil.

6. A Multi-channel RE transmit system comprising:
   an RF transmitter arrangement having a plurality of RF transmitter elements for generating an RF field for exciting nuclear magnetic resonances in an MRI system; and
   a plurality of segments formed from the plurality of RF transmitter elements in at least two spatial directions selected from a direction of a main magnetic field of the MRI system, a z-direction, and a longitudinal direction;
   a plurality of RF waveform generators and RF amplifiers for generating RF transmit signals for individually feeding the RF transmitter elements and/or segments.

7. The multi-channel RF transmit system according to claim 6, wherein the multi-channel RF transmit system is configured as a magnetic resonance imaging system.

8. A method for generating an RF field comprising acts of:
   generating an RF field with an RF transmitter arrangement having a plurality of RF transmitter elements with a plurality of segments formed from the plurality of RF transmitter elements in at least two spatial directions selected from a direction of a main magnetic field of an MRI system, a z-direction, and a longitudinal direction for exciting nuclear magnetic resonances in the MRI system; and
   generating a desired pattern of the RF field by individually controlling one or more of the transmitter elements and/or one or more of the segments.

9. A computer program comprising a computer program code stored on a computer readable non-transitory medium adapted to perform a method when said program is run on a programmable microcomputer, the method comprising acts of:
   generating an RF field with an RF transmitter arrangement having a plurality of RF transmitter elements with a plurality of segments formed from the plurality of RF transmitter elements in at least two spatial directions selected from a direction of a main magnetic field of an MRI system, a z-direction, and a longitudinal direction for exciting nuclear magnetic resonances in the MRI system; and
   generating a desired pattern of the RF field by individually controlling one or more of the transmitter elements and/or one or more of the segments.

* * * * *